July 6, 1965 R. E. SWANSON 3,193,737

BISTABLE JUNCTION TRANSISTOR

Original Filed May 18, 1955

INVENTOR.
ROBERT E. SWANSON
BY [signature]
ATTORNEY

United States Patent Office 3,193,737

Patented July 6, 1965

3,193,737

BISTABLE JUNCTION TRANSISTOR

Robert E. Swanson, Poughkeepsie, N.Y., assignor to International Business Machines Corporation, New York, N.Y., a corporation of New York Filed May 18, 1955, Ser. No. 509,265

11 Claims. (Cl. 317—234)

The present invention relates to junction transistors having high current amplification and connectable to provide bistable circuits.

There is disclosed and claimed in the copending application of Richard F. Rutz, Serial No. 458,619, filed September 27, 1954, now U.S. Patent No. 2,889,499, issued June 2, 1959, and entitled "Bistable Semiconductor Device," a transistor comprising a semi-conductive body having a junction between two zones of opposite conductivity types, which junction serves as an emitter, a base input electrode connected to one of the two zones, and a point contact collector electrode connected to the same zone as the base. That transistor, as shown in FIG. 7 of that application, is connectable in a bistable circuit, the bistable effects being attained by virtue of an inherent internal feedback at the point contact collector electrode. That transistor has a very high intrinsic current amplification at the collector electrode and is capable of carrying substantial currents with low power losses.

There is disclosed in the article entitled "PN Junction Transistors," by Shockley, Sparks and Teal, in volume 83, No. 1, of the Physical Review for July 1, 1951, pages 151 to 162, and particularly in the section VII(B) entitled "Hook Collector in PNPN Transistor" on pages 156 and 157, a junction transistor similar to the now familiar PNP junction transistor, but having a collector in the form of a further junction between regions of opposite conductivity types, said further junction being termed a "PN hook."

Such a PN hook has a high intrinsic current amplification factor and also has higher current carrying capacity than the conventional point contact.

An object of the present invention is to provide an improved transistor of the type shown in the Rutz application mentioned above. More specifically, an object is to improve the Rutz transistor so as to make its back resistance under OFF conditions higher, its forward resistance under saturation conditions lower, and its intrinsic current amplification higher.

Another object is to provide a transistor of the type described having increased reliability, i.e. having greater consistency between individual transistors, and having smaller changes in characteristics with changes in time and temperature.

Another object of the invention is to provide a transistor of the type described having a single body of semi-conductive material with complementary symmetry of the regions of opposite conductivity types, and terminals arranged so that it may be connected in circuit configurations which conventionally would require either an NPN or a PNP transistor.

Another object is to provide improved methods of making transistors of the type described.

The foregoing and other objects of the invention are attained in the transistor structures and manufacturing methods described herein, by providing a semi-conductive body having two end regions and two intermediate regions, the regions being connected in series and of alternately opposite conductivity types, so that each two adjacent regions are separated by boundary junctions. The spacing of each junction from the next is made substantially equal to or less than the diffusion length for the average lifetime of the minority carriers of the region between the junctions. Ohmic electrical connections are made to the two end regions and to one of the intermediate regions. The intermediate region to which the electrical connection is made may then serve as the base of the transistor. The next adjacent end region serves as an emitter and the other end region serves as a collector.

By providing ohmic connections to both the intermediate regions, the transistor may be used either as an NPN or as a PNP junction transistor.

Several methods of making such a transistor are described herein. The preferred method is to grow a crystal of semi-conductive material having three regions of alternately opposite conductivity types, with the intermediate region having the required thickness, then to grind down one of the end regions to reduce its thickness to the required small dimension, and then to alloy in a fourth region of opposite conductivity type in the region which has been ground down.

Other objects and advantages of the invention will become apparent from a consideration of the following description taken together with the accompanying drawing.

Figure 1:
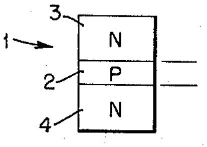
FIG. 1 is a schematic illustration of NPN junction transistor from which a transistor according to the present invention may be formed.
Figure 2:
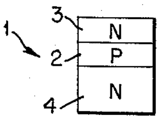
FIG. 2 is a schematic illustration, similar to FIG. 1, showing the transistor after one of the end regions has been reduced in thickness.
Figure 3:
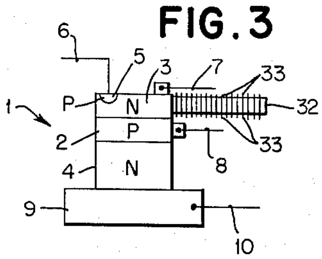
FIG. 3 is a schematic view, similar to FIGS. 1 and 2, showing a completed transistor embodying the invention.

*FIGURES 1 to 3*

FIG. 1 illustrates schematically a conventional NPN junction transistor body 1 having a thin central P region 2 whose thickness is substantially equal to or less than the diffusion length for the average lifetime of the minority carriers in that P region. For commonly used materials, the thickness of the P region should be .001" or less. It is conventional to construct NPN transistor bodies with central P regions of such dimensions, by well known processes. The body 1 also has on either end N regions 3 and 4, whose thickness is not critical.

In FIG. 2, the transistor body 1 is shown after it has been subjected to further processing by having its end region 3 ground down until it is substantially the same thickness as the P region 2. Prior to this grinding operation, the transistor body may be etched with any of several well known etching solutions, for example a combination of acetic acid, nitric acid, hydrofluoric acid, and bromine and water, to make the N and P regions visible so that the grinding operation may be controlled accurately to reduce the N region 3 to the required thickness. It is convenient to grind the region 3 down to a thickness of about .005".

In FIG. 3, the transistor body 1 is shown after it has been subjected to a further process in which a small P region 5 is alloyed into the end region 3 by any of several well known alloying techniques. Typically, a wire 6 of material such as gold with a selected impurity, for example indium, if a P region is to be formed, is brought into contact with the N region and is welded to it by passing a sufficiently high current through 1, the P region 5 being formed by solid diffusion of the impurity, and by heat and current flow. Wires 7 and 8 are then attached, as by soldering, to the N region 3 and P region 2, respectively, and the bottom of the N region 4 is soldered to a large supporting block 9 of electrically conductive material, to which a wire 10 is connected. The alloying of the P region 5 is controlled to make the distance between P region 5 and P region 2 about .001", i.e. substantially no greater than the diffusion length for the average lifetime of minority carriers in the intervening N region 3.

When the transistor of FIG. 3 is connected in a circuit employing high currents, for which this transistor is particularly suited, it is highly desirable and in many cases necessary that heat dissipating means, commonly termed a heat sink, be provided in association with the emitter junction. Such a heat sink is shown at 32 in FIG. 3 and comprises a bar of copper or other heat conducting material, in heat conducting engagement with the region 3. The heat sink 32 may be provided with fins 33 to aid in the dissipation of heat. The heat sink may have an ohmic connection to the region 3. Alternatively, the heat sink may be connected to the region 5, since most of the heat is developed at the junction between those regions. The heat sink should be in as good heat conducting relation with that junction as conveniently possible, but it must not, of course, short circuit the junction.

Figure 4:
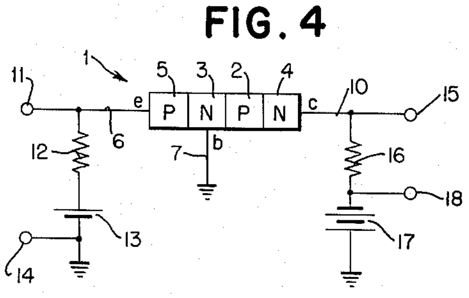
FIG. 4 is an electrical wiring diagram of one type of circuit in which a transistor according to the invention may be connected.
Figure 5:
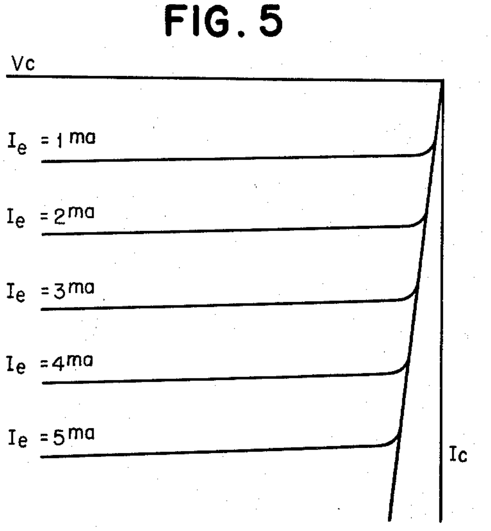
FIG. 5 is a graphical illustration of the electrical characteristics of the transistor of FIG. 4.

*FIGURES 4 and 5*

The transistor of FIG. 3 may be connected as shown in the wiring diagram of FIG. 4. In FIG. 4, the emitter connection is made through wire 6 to region 5, the junction between P region 5 and N region 3 serving as the emitter. The wire 7 serves as the base connection to the N region 3. The P region 21 is not connected electrically to any external circuit, the wire 8 of FIG. 3 being unused. The collector connection is made through wire 10 to N region 4, the N region 4 and the P region 2 cooperating to form a PN hook collector.

The wire 6 is connected to an input terminal 11, and is also connected through a resistor 12 and a biasing battery 13 to ground. Another input terminal 14 is also connected to ground.

The wire 10 is connected to an output terminal 15. The wire 10 is also connected through a resistor 16 and a battery 17 to ground. Another output terminal 18 is connected to the common junction of resistor 16 and battery 17.

FIG. 5 shows the collector volt-ampere characteristics of the transistor as connected in FIG. 2. This family of curves shows the variation of collector volts ($V_c$) with collector current ($I_c$) for different constant values of emitter current ($I_e$). It may be seen that as soon as the collector potential exceeds a minimum value, the collector current remains substantially constant as long as the emitter current remains constant, over a wide range of collector potential values.

Figure 6:
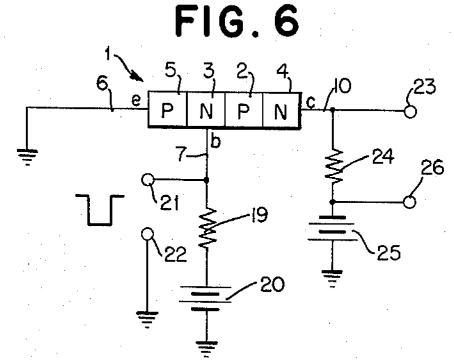
FIG. 6 is a wiring diagram of another circuit in which the transistor may be connected.
Figures 7, 8:
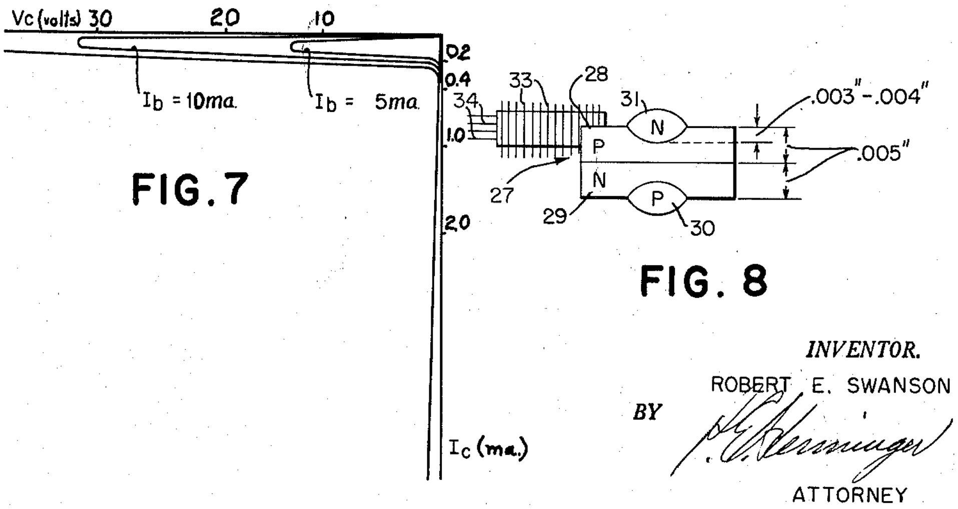
FIG. 7 is a graphical illustration of the electrical characteristics of the circuit of FIG. 6.
FIG. 8 is a schematic diagram of another form of transistor body constructed in accordance with the invention.

*FIGURES 6 and 7*

FIG. 6 shows the transistor of FIG. 3 connected in a somewhat different circuit. In FIG. 6, the emitter connection wire 6 is grounded. The base connection wire 7 is connected through a resistor 19 and a biasing battery 20 to ground. Wire 7 is also connected to an input terminal 21, and another input terminal 22 is grounded. The collector connection wire 10 is connected to an output terminal 23 and is also connected through a resistor 24 and a battery 25 to ground. Another output terminal 26 is connected to the common junction 24 and battery 25. The circuit of FIG. 6 produces a substantial current output, and is suitable for driving a load such as a relay or electromagnet. The provision of a heat sink on the transistor is a practical necessity in the circit of FIG. 6.

FIG. 7 shows a collector volt ampere characteristic of the circuit configuration of FIG. 6 for various values of base current. It may be seen that for small values of collector current, the collector potential may be high, but that as soon as a very small minimum value of collector current is exceeded, then the collector potential thereafter remains constant and very low for all further increases in collector current. Since the family of characteristics shown in FIG. 7 represent the characteristics for the circuit of FIG. 6, they may be described as grounded emitter or common emitter characteristics. Each of the curves in FIG. 7 shows a very low current region in which the resistance is positive, i.e., the curves slope downwardly to the left from the origin. That positive resistance region is followed by a negative resistance region in which the curves slope downwardly to the right. The negative resistance region is in turn followed by another positive resistance region in which the curves slope steeply downward to the left. The first positive resistance region described above is a high resistance region, having a relatively large change in potential for a given change in current. The second positive resistance region is a low resistance region having a relatively small change in potential for a given change in current.

Comparing the characteristics shown in FIG. 7 with those of the transistor described in the Rutz Patent No. 2,889,499, mentioned above, whose characteristics are shown in FIG. 8 of that patent, it may be seen that the collector potential reaches its final constant value in the instant case at a much lower value of collector current. In other words, the transistor reaches its minimum output impedance condition at a lower collector current than does the transistor of the Rutz application. One transistor constructed in accordance with the invention has a saturation resistance of approximately 40 ohms, a back resistance in its OFF condition of approximately 100,000 ohms and an intrinsic curreent amplification of 30 in the collector.

The transistors of the present invention have higher back resistance in the OFF condition than other transistors of comparable current carrying capacities, thereby limiting the power loss in the OFF condition to a lower valuec. Furthermore, the saturation resistance is lower than that of prior transistors such as that shown by Rutz, thereby providing reduced power loss for a given power output. The intrinsic current amplification at the collector is higher than in prior art transistors.

*FIGURE 8*

FIG. 8 illustrates a modified form of transistor structure constructed according to a modified construction procedure in accordance with the invention. There is shown in FIG. 8 a transistor body 27 comprising a P region 28 and an N region 29. The body consisting of these two zones may be grown as a monocrystal according to any conventional process. The thickness of each of these two zones should be about .005" or less. Into each of these regions there is alloyed another smaller region of the opposite conductivity type. Specifically, a small P region 30 is alloyed into the N region 29, and a small N region 31 is alloyed into the P region 28. The depth of pentration of the regions 30 and 31 should be about .003"–.004". This leaves the spacing between each adjacent pair of boundary junctions substantially equal to or less than the diffusion length for the average lifetime of minority carriers in the intervening region. Ohmic connections may be made to all four of the regions.

A heat sink 33, having fins 34, is shown in heat dissipating relation with the region 28.

When connections are made to all four of the regions, as shown in FIG. 3, then the transistor may be connected as shown in FIGS. 4 and 6, in any circuit whose polarity requirements are similar to those of a conventional PNP junction transistor. By using the wire 8 as the base connection rather than the wire 7, the polarities within the transistor are reversed so that the wire 10 then becomes an emitter connection and the wire 6 a collector connection. Such an arrangement may be connected in any circuit having polarity requirements similar to those of a conventional NPN junction transistor.

While I have shown and described certain preferred embodiments of my invention, other modifications thereof will readily occur to those skilled in the art, and I therefore intend the invention to be limited only by the appended claims.

I claim:

1. An amplifying asymmetrically conductive device comprising:

(a) a monocrystalline wafer of semiconductive material having two parallel surfaces and having therein first and second spaced zones of one-conductivity type semiconductive material separated by the contiguous with a third zone of opposite conductivity-type semiconductive material, the interfaces between said third zone and said first and second zones comprising first and second PN junctions, said first junction having at least a portion parallel to said surfaces;

(b) said first zone of one conductivity type defined in part by said first PN junction and by a portion of one of said parallel surfaces;

(c) said second zone of one conductivity type defined in part by said second PN junction;

(d) said third zone of opposite conductivity type defined in part by said first and second PN junctions;

(e) one of said second and third zones being further defined in part by the other of said parallel surfaces;

(f) a mass of opposite conductivity type inducing activator impurity fused to and alloyed with a surface region of said first zone at said one of said parallel surfaces and producing therein a third, fused PN junction, said fused junction being located within one diffusion length of said third zone;

(g) a first electrode contacting said mass of activator material;

(h) a second electrode contacting said first zone on said one of said parallel surfaces and in close proximity to said first electrode; and (i) a third electrode contacting said second zone, said parallel portion of said first PN junction spanning the localities on said one of said parallel surfaces of said first electrode and said second electrode.

2. An amplifying asymmetrically conductive device as defined in claim 1, wherein at least one of said first and second PN junctions is parallel throughout its extent to said parallel surfaces.

3. An amplifying asymmetrically conductive device as defined in claim 1, in which:

(a) said second zone is defined in part by said other of said parallel surfaces;

(b) said second PN junction is parallel throughout its extent to said parallel surfaces.

4. An amplifying asymmetrically conductive device as defined in claim 3, in which said first PN junction is parallel throughout its extent to said parallel surfaces.

5. An amplifying asymmetrically conductive device comprising:

(a) a monocrystalline wafer of semiconductive material having two parallel surfaces and having therein first and second zones of one-conductivity type semiconductive material separated by and contiguous with a third zone of opposite conductivity type semiconductive material, the interfaces between said third third zone and said first and second zones comprising first and second PN junctions, said first junction having at least a portion parallel to said surfaces;

(b) said first zone of one conductivity type defined in part by said first PN junction and by a portion of one of said parallel surfaces;

(c) said second zone of one conductivity type defined in part by said second PN junction;

(d) said third zone of opposite conductivity type defined in part by said first and second PN junctions;

(e) one of said second and third zones being further defined in part by the other of said parallel surfaces;

(f) a mass of opposite conductivity type inducing activator impurity fused to and alloyed with a surface portion of said first zone at said one of said parallel surfaces and producing therein a third, fused PN junction, said fused junction being located within one diffusion length of said opposite-conductivity type zone; and (g) an emitter electrode contacting said mass of activator material;

(h) a base electrode contacting said first zone on said one of said parallel surfaces and in close proximity to said emitter electrode; and (i) a collector electrode in non-rectifying contact with said second zone; said parallel portion of said first PN junction spanning said localities on said one of said parallel surfaces of said emitter electrode and said base electrode; and (j) load means connected between the emitter electrode and collector electrode of said device, and independent input means for controlling the base current to said device, whereby said device exhibits a family of common emitter output potential-current characteristics each defined by two discrete regions of positive resistance separated by a negative resistance region.

6. An amplifying asymmetrically conductive device comprising:

(a) a monocrystalline wafer of semiconductive material having opposed major parallel surfaces and having therein first and second zones of one conductivity type semiconductive material separated by and contiguous with a thin planar zone of opposite-conductivity type semiconductive material, the interfaces between said thin planar zone and the remainder of said wafer comprising first and second PN junctions, said first junction having at least a portion parallel to said surfaces;

(b) said first zone of one conductivity type defined in part by said first PN junction and by a portion of one of said major parallel surfaces;

(c) said second zone of one conductivity type defined in part by said second PN junction;

(d) said thin planar zone constituting a third zone of opposite conductivity type defined in part by said first and second PN junctions;

(e) one of said second and third zones being further defined in part by the other of said major parallel surfaces;

(f) a mass of opposite-conductivity type inducing activator impurity fused to and alloyed with a first portion of said one of said major surfaces of said wafer and producing in the body of said wafer a third, fused PN junction, said fused junction being located within one diffusion length of said opposite conductivity type zone; and (g) a first electrode contacting said mass of activator material;

(h) a second electrode contacting a second portion of said one of said major surfaces of said wafer in close proximity to said first electrode; and (i) a third electrode contacting the opposite major surface of said wafer; said parallel portion of said first PN junction spanning said localities on said one of said major surfaces of said first electrode and said second electrode.

7. An amplifying asymmetrically conductive device comprising:

(a) a monocrystalline wafer of semiconductive material having opposed major parallel surfaces and having therein first and second zones of one conductivity-type semiconductive material separated by and contiguous with a thin planar zone of opposite-conductivity type semiconductor material, the interfaces between said thin planar zone and the remainder of said wafer comprising first and second PN junctions, said first junction having at least a portion parallel to said surfaces;

(b) said first zone of one conductivity type defined in part by said first PN junction and by a portion of one of said major parallel surfaces;

(c) said second zone of one conductivity type defined in part by said second PN junction;

(d) said thin planar zone constituting a third zone of opposite conductivity type defined in part by said first and second PN junction;

(e) one of said second and third zones being further defined in part by the other of said major parallel surfaces;

(f) a mass of opposite conductivity type inducing activator impurity fused to and alloyed with a first portion of said one of said major surfaces of said wafer and producing in the body of said wafer, a third, fused PN junction, said fused junction being located within one diffusion length of said opposite-conductivity type zone;

(g) an emitter electrode contacting said mass of activator material;

(h) a base electrode in non-rectifying contact with a second portion of said one of said major surfaces of said wafer and in close proximity to said emitter electrode; and (i) a collector electrode in non-rectifying contact with the opposite major surface of said wafer; said parallel portion of said first PN junction spanning said localities on said one of said major parallel surfaces of said emitter electrode and said base electrode.

8. A transistor comprising:

(a) a body of semiconductive material having three regions therein;

(b) first and second contiguous regions being of opposite extrinsic conductivity types;

(c) the interface between said first and second regions comprising a first PN junction;

(d) said first region having a surface parallel to the first PN junction and spaced therefrom by a distance no greater than about 0.005";

(e) a fourth region of conductivity type opposite to said first region, said fourth region comprising a mass of said opposite conductivity type inducing activator impurity fused to and alloyed with said first region at a portion of said surface and producing therein a fused PN junction spaced from the first PN junction by a distance no greater than the diffusion length for the average lifetime of minority carriers in said first region;

(f) a first electrical connection to said fourth region at a surface locality thereon; and (g) a second electrical connection to said first region at a locality on said surface thereof;

(h) said first PN junction spanning the localities of attachment of said first and second electrical connections.

9. A high-current three terminal PNPN semiconductor switching device comprising:

(a) a single crystal wafer of a semiconductive material having a first and a second region of a first type semiconductivity separated by a region of a second type semiconductivity having two parallel surfaces, the first and second regions of first type semiconductivity each having one surface contiguous and coextensive with one of the parallel surfaces of said region of second type semiconductivity;

(b) a PN junction between each of the regions of first type semiconductivity and the region of second type semiconductivity;

(c) an emitter of second type semiconductivity fused to another surface of the first region of first type semiconductivity;

(d) a PN junction between the emitter and the said first region;

(e) a base contact affixed to the same surface of the first region as the emitter, said emitter and said base contact being spanned by the PN junction between one of the regions of first type semiconductivity and the regions of second type semiconductivity;

(f) an ohmic solder fused to another surface of the second region of first type semiconductivity; and (g) means for making one electrical connection to each of the regions of first type semiconductivity and to the emitter.

10. A high-current three terminal PNPN semiconductor switching device as defined in claim 9, wherein said single crystal wafer has opposed major parallel surfaces, one of said opposed surfaces constituting the surface to which said emitter is fused; and wherein at least one of the PN junctions defined by each of the regions of first type semiconductivity and the region of second type semiconductivity is parallel throughout its extent to said opposed major parallel surfaces.

11. A high-current three terminal PNPN semiconductor switching device as defined in claim 9, wherein said first region is the base and said second region is the collector, and including load means connected between the emitter and collector of said device, and independent input means for controlling the base current to said device, whereby said device exhibits a family of common emitter output potential-current characteristics each defined by two discrete regions of positive resistance separated by a negative resistance region.

References Cited by the Examiner

UNITED STATES PATENTS

| | | | |
|---|---|---|---|
| 2,623,105 | 12/52 | Shockley | 148—1.5 |
| 2,655,610 | 10/53 | Ebers | 307—88.5 |
| 2,697,052 | 12/54 | Dacey et al. | 148—1.5 |
| 2,735,050 | 2/56 | Armstrong | 317—235 |
| 2,745,038 | 5/56 | Sziklai. | |
| 2,767,358 | 10/56 | Early | 317—235 |
| 2,806,983 | 9/57 | Hall | 307—88.5 X |
| 2,811,653 | 10/57 | Moore | 307—88.5 |
| 2,861,229 | 11/58 | Pankove | 317—235 |

JOHN W. HUCKERT, *Primary Examiner.*

SAMUEL BERNSTEIN, ARTHUR GAUSS, *Examiners.*

UNITED STATES PATENT OFFICE

CERTIFICATE OF CORRECTION

Patent No. 3,193,737

July 6, 1965

Robert E. Swanson

It is hereby certified that error appears in the above numbered patent requiring correction and that the said Letters Patent should read as corrected below.

Column 3, line 36, for "21" read -- 2 --; column 4, line 36 for "curreent" read -- current --; line 42, for "valuee" read -- value --; line 61, for "pentration" read -- penetration --; column 5, line 17, for "the" read -- and --; line 67, strike out "third"; column 7, line 2, for "semiconductor" read -- semiconductive --.

Signed and sealed this 7th day of December 1965.

(SEAL)
Attest:

ERNEST W. SWIDER
Attesting Officer

EDWARD J. BRENNER
Commissioner of Patents